United States Patent
Yamashita (10) Patent No.: US 7,598,498 B2
(45) Date of Patent: Oct. 6, 2009

(54) ELECTRIC FIELD LENS AND ION IMPLANTER HAVING THE SAME

(75) Inventor: Takatoshi Yamashita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 259 days.

(21) Appl. No.: 11/890,968

(22) Filed: Aug. 8, 2007

(65) Prior Publication Data

US 2008/0035856 A1    Feb. 14, 2008

(51) Int. Cl.
*H01J 3/18*    (2006.01)
*H01J 37/12*    (2006.01)

(52) U.S. Cl. .................. 250/398; 250/396 R
(58) Field of Classification Search ............ 250/492.2, 250/397, 396 R, 427, 398, 441.11
See application file for complete search history.

(56) References Cited

U.S. PATENT DOCUMENTS 4,987,345 A * 1/1991 Stormberg et al. ..... 315/111.21
5,091,655 A * 2/1992 Dykstra et al. ........... 250/492.2
5,177,366 A * 1/1993 King et al. ................ 250/492.2
5,254,856 A * 10/1993 Matsui et al. .................. 850/9
5,362,968 A * 11/1994 Miyoshi et al. ......... 250/396 R
2006/0043316 A1* 3/2006 Liebert et al. ........... 250/492.21
2006/0097193 A1* 5/2006 Horsky et al. .......... 250/492.21
2008/0135777 A1* 6/2008 Yamashita et al. .......... 250/397
2009/0090872 A1* 4/2009 Horsky et al. ............... 250/427

OTHER PUBLICATIONS

"Electron and ion beam engineering", first edition, The Institute of Electrical Engineers of Japan, Mar. 1, 1995, pp. 105-108 (5 pages).

* cited by examiner

*Primary Examiner*—Nikita Wells
*Assistant Examiner*—Johnnie L Smith
(74) *Attorney, Agent, or Firm*—Osha • Liang LLP (57) ABSTRACT

An electric field lens includes an entrance electrode, an intermediate electrode, and an exit electrode that are arranged in a traveling direction of ion beams. The intermediate electrode is maintained in a positive potential, and the entrance electrode and the exit electrode are maintained in a ground potential. In addition, the electric field lens includes a first control electrode and a second control electrode that are disposed between the entrance electrode and the intermediate electrode and between the intermediate electrode and the exit electrode, respectively and maintained in a negative potential.

7 Claims, 7 Drawing Sheets

ELECTRIC FIELD LENS AND ION IMPLANTER HAVING THE SAME

This application claims priority to Japanese Patent Application No. 2006-219825, filed Aug. 11, 2006, in the Japanese Patent Office. The priority application is incorporated by reference in its entirety.

TECHNICAL FIELD

The present disclosure relates to an electric field lens (which is called an electrostatic lens) used for an ion implanter for focusing ion beams, and an ion implanter having the electric field lens.

RELATED ART

An electric field lens for focusing ion beams (in the specification, positive ion beams) is disclosed in, for example, Non-Patent Document 1.

Figure 7:
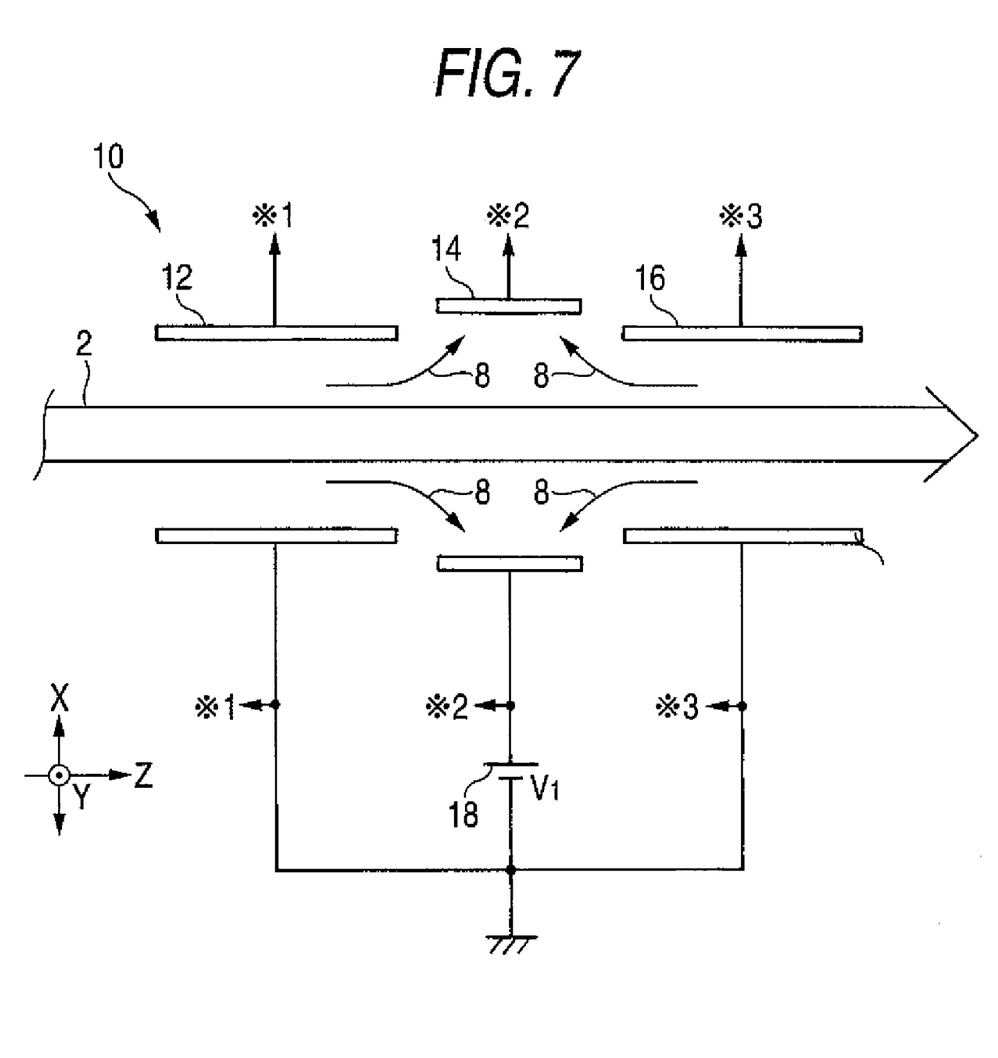
FIG. 7 is a top plan view showing an example of a known electric field lens along with a power source.

An example of the electric field lens is shown in FIG. 7. The electric field lens 10 includes an entrance electrode 12, an intermediate electrode 14, and an exit electrode 16 that are mutually spaced in a traveling Z direction of ion beams 2. The potentials of the entrance electrode 12 and the exit electrode 16 are maintained equally (a ground potential in the example in FIG. 7). Since a positive (in the example in FIG. 7) or a negative DC voltage $V_1$ is applied to the intermediate electrode 14 from a DC power source 18, the potentials of the entrance electrode 12 and the exit electrode 16 are maintained differently from each other. Each of the electrodes 12, 14, and 16 each has a shape depending on the shape of the ion beams 2. For example, the electrodes may be a cylindrical electrode or a parallel flat electrode.

An electric field lens 10 functions as an einzel lens (which, namely, is a unipotential lens and the following description is the same). Specifically, the electric field lens 10 carries out a function of focusing the ion beams 2, for example, in the X direction without variation in energy of the ion beams 2 even when one of positive and negative DC voltages $V_1$ is applied to the intermediate electrode 14. For convenience sake, FIG. 7 simply shows that the ion beams 2 are not focused, but in fact, the ion beams 2 are focused (where the same applies in FIGS. 1 and 3).

When a negative DC voltage $V_1$ is applied to the intermediate electrode 14, the ion beams 2 that accelerate in an area between the entrance electrode 12 and the intermediate electrode 14, and then decelerate in an area between the intermediate electrode 14 and the exit electrode 16, thereby becoming an original energy. In such an acceleration area, when the ion beams 2 collide with a residual gas and then neutral particles are generated by a charge conversion, the energy of the neutral particles are higher than those of the incident ion beams 2. Hence, the neutral particles proceeding to the downstream side causes energy contamination of a high-energy element (infected with an undesirable energy element).

As shown in FIG. 7, a positive DC voltage $V_1$ is applied to the intermediate electrode 14. At this time, the ion beams 2 that are decelerated in the area between the entrance electrode 12 and the intermediate electrode 14, and then are accelerated in the area between the intermediate electrode 14 and the exit electrode 16 become the original energy. In such a deceleration area, when the ion beams 2 collide with a residual gas and then the neutral particles are generated by the charge conversion, the energy of the neutral particles is lower than those of the incident ion beams 2. Hence, the neutral particles proceeding to the downstream side causes energy contamination of a low-energy element.

When implanting ions into a target, in consideration of which is advantageous between the above-described two energy contaminations, any one of the positive and negative DC voltages (polarity) applied to the intermediate electrode 14 is selected. For example, when implanting a low-energy of about 10 keV or less, the energy contamination of the low-energy element which has an energy lower than the incident ion beams 2 hardly cause a problem, comparing with the energy contamination of the high-energy element.

[Non-Patent Document 1] Author: Takagi Toshinori, the university lecture of the Institute of Electrical Engineers, "Electron and ion beam engineering", first edition, The Institute of Electrical Engineers of Japan, Mar. 1, 1995, page 105-108

When the DC voltage $V_1$ is applied to the intermediate electrode 14 and thus maintained in a positive potential, the above-mentioned energy contamination of the high-energy element does not occur. The energy contamination does not cause any problem, but there are the following problems to be solved.

That is, when a positive DC voltage $V_1$ is applied to the intermediate electrode 14, as shown in FIG. 7, electrons 8 placed in drift spaces (spaces in which there is no electric field on the more upstream and downstream sides than the vicinity of the intermediate electrode 14) where there is no electric field is attracted to the intermediate electrode 14 and annihilated. Hence, a quantity of electrons in the drift space decreases and thereby a divergence of the ion beams 2 becomes stronger due to a space-charge effect. Accordingly, the transport efficiency of the ion beams 2 is lowered. That is why when the divergence becomes stronger, the ion beams 2 collide with a structure (for example, a resolving slit, a mask, and a wall surface of a vacuum vessel) in a transporting path and thus a loss ratio increases.

SUMMARY

Exemplary embodiments of the present invention provide an electric field lens capable of suppressing a decrease in quantity of electrons in the drift space and further suppressing the divergence of the ion beams due to the space-charge effect even when the intermediate electrode is maintained in a positive potential.

According to a first aspect of the present invention, there is provided an electric field lens including an entrance electrode, an intermediate electrode, and an exit electrode mutually spaced in a traveling direction of an ion beam, in which the intermediate electrode is maintained in a positive potential and the entrance electrode and the exit electrode are maintained in a potential lower than the intermediate electrode so as to focus the ion beam, the electric field lens including a first control electrode that is disposed between the intermediate electrode and the entrance electrode and that is maintained in a potential lower than the entrance electrode; and a second control electrode that is disposed between the intermediate electrode and the exit electrode and that is maintained in a potential lower than the exit electrode.

According to the electric field lens, since the potentials of the first control electrode and the second control electrode are maintained lower than those of the entrance electrode and the exit electrode, an electric filed formed by the first control electrode and the second control electrode pushes the electrons to enter from drift spaces on the upstream and downstream sides of the intermediate electrode to the intermediate electrode so that the electrons are returned. As a result, the electrons can be prevented from being attracted to the intermediate electrode and annihilated.

According to a second aspect of the present invention, the electric field lens having the above-described configuration may include a first ground electrode that is disposed between the intermediate electrode and the first control electrode and that is maintained in a ground potential; and a second ground electrode that is disposed between the intermediate electrode and the second control electrode and that is maintained in a ground potential.

According to a third aspect of the present invention, in the electric field lens having the above-described configuration, the entrance electrode and the exit electrode may be maintained in a ground potential, and the first control electrode and the second control electrode may be maintained in a negative potential.

According to a fourth aspect of the present invention, in the electric field lens having the above-described configuration, when two directions perpendicular to each other in a plane perpendicular to the traveling direction of the ion beam are denoted by an X direction and a Y direction, the ion beam may have a ribbon shape in which an Y-direction size is larger than a X-direction size, and the respective electrodes may be disposed opposite each other in the X direction with an ion beam-transmitting space interposed therebetween and may include a pair of electrode pieces substantially parallel to a main plane of the ion beam, so as to focus the ion beam in the X direction.

According to a fifth aspect of the present invention, there is provided an ion implanter including the electric field lens and allowing the ion beam having passed through the electric field lens to be incident on a target.

One or more exemplary embodiments of the present invention may include one or more the following advantages. For example, according to the first aspect of the present invention, since the potentials of the first control electrode and the second control electrode are maintained lower than those of the entrance electrode and the exit electrode, an electric field formed by the first control electrode and the second control electrode pushes the electrons to enter from drift spaces on the upstream and downstream side of the intermediate electrode to the intermediate electrode so that the electrons are returned. As a result, the electrons can be prevented from being attracted to the intermediate electrode and annihilated. Even when the intermediate electrode is maintained in a positive potential, it is possible to prevent a quantity of the electrons from decreasing in the drift space and to further suppressing a divergence of the ion beams caused by the space-charge effect. Therefore, it is possible to suppress a reduction of transporting efficiency of the ion beams caused by a space-charge effect.

Moreover, since the intermediate electrode is maintained in a positive potential and the potentials of the entrance electrode and the exit electrode are maintained lower than that of the intermediate electrode, it is possible to suppress occurrences of energy contamination of an element having a higher energy than the incident ion beams.

According to the second aspect of the present invention, the following advantage can be further obtained. Since it is possible to suppress that a positive electric field formed by the intermediate electrode protrudes toward the first control electrode and the second control electrode by means of a ground potential formed by the first ground electrode and the second ground electrode and a space distance due to existence of the electrodes, the first control electrode and the second control electrode easily form an electric field for returning the electrons in the drift space. Therefore, the voltages that are applied to the first control electrode and the second control electrode may be small.

According to the third aspect of the present invention, since the electric lens functions as an einzel lens, it is possible to acquire an effect that the ion beams are focused without a variation in an energy of the ion beams.

According to the fourth aspect of the present invention, it is possible to acquire an effect that ribbon-like ion beams are focused in an X direction.

According to the fifth aspect of the present invention, since the ion implanter includes the above-mentioned electric field lens, it is possible to acquire the same effect as the above-mentioned Aspects.

Other features and advantages may be apparent from the following detailed description, the accompanying drawings and the claims.

DETAILED DESCRIPTION

Figure 1:
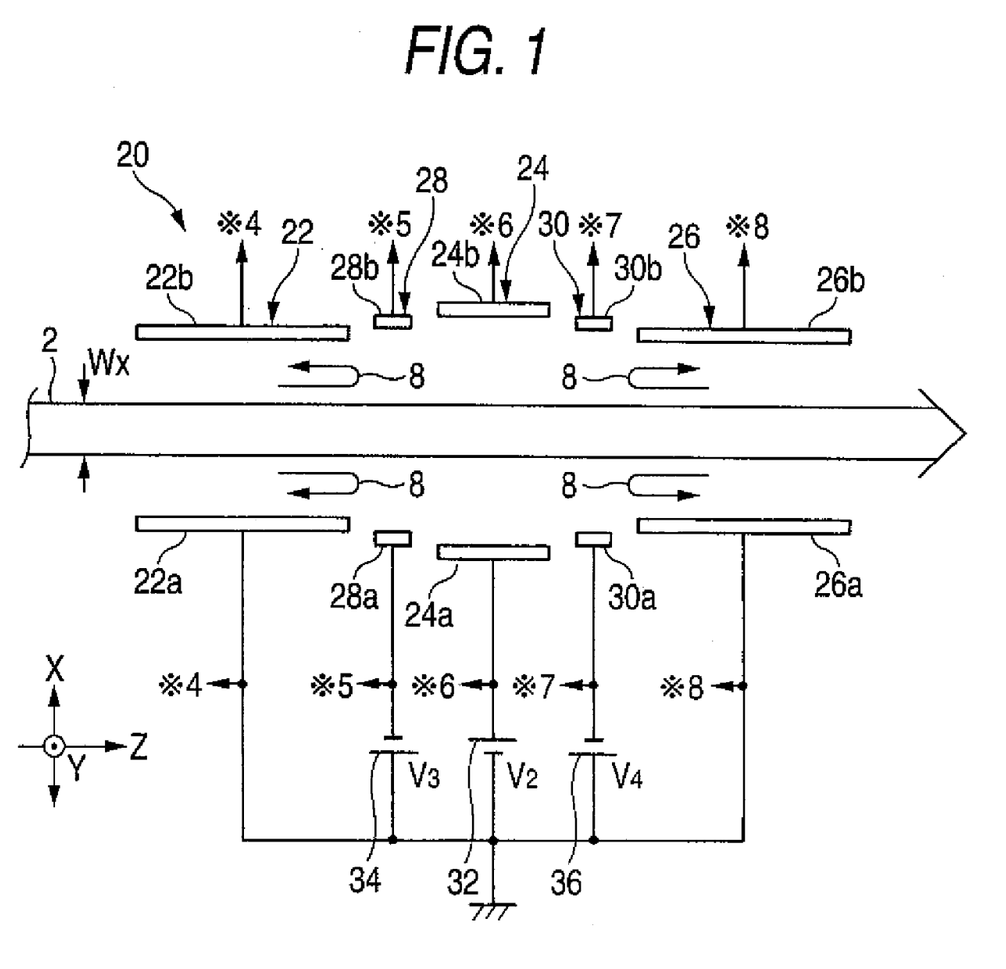
FIG. 1 is a top plan view showing an electric field lens along with a power source according to an exemplary embodiment of the present invention.
Figure 2:
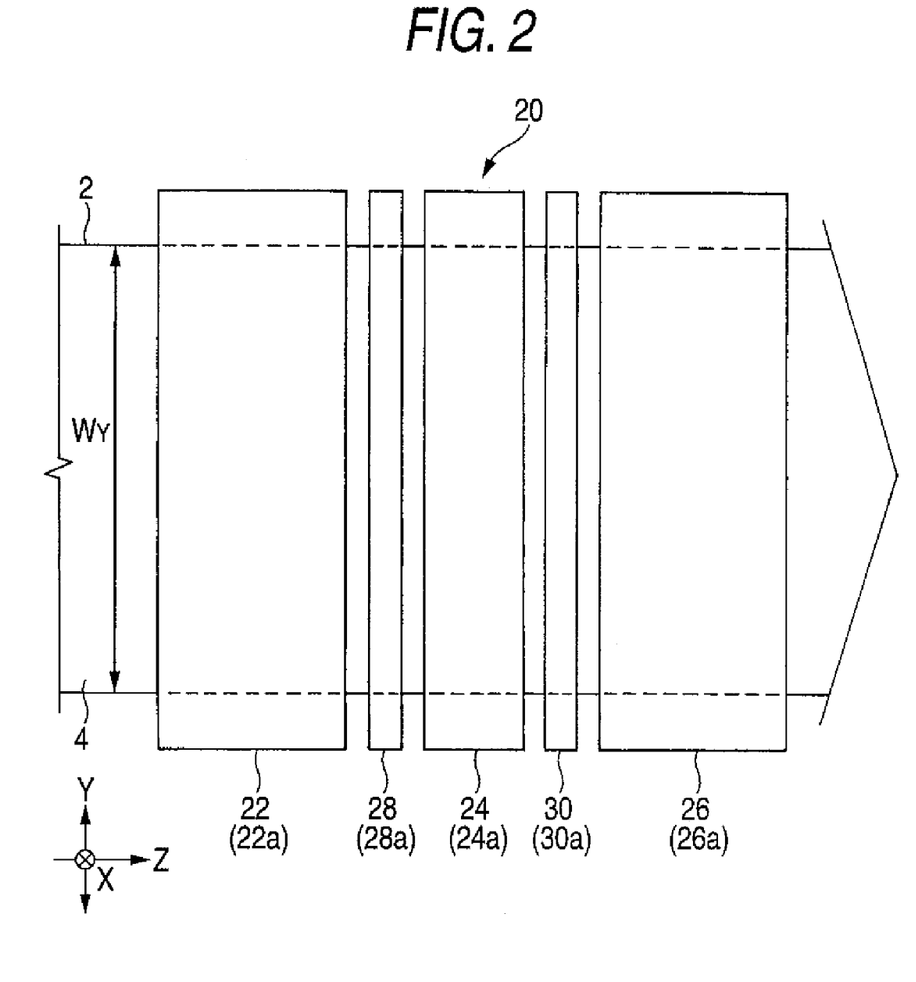
FIG. 2 is a front view showing the electric field lens in FIG. 1.

FIG. 1 is a top plan view showing an electric field lens along with a power source according to an exemplary embodiment of the present invention. FIG. 2 is a front view showing the electric field lens in FIG. 1. For example, an electric field lens 20 focuses ribbon-like ion beams 2 in an X direction. As described above, for convenience sake, it is simply illustrated that the ion beams 2 are focused.

Figure 5:
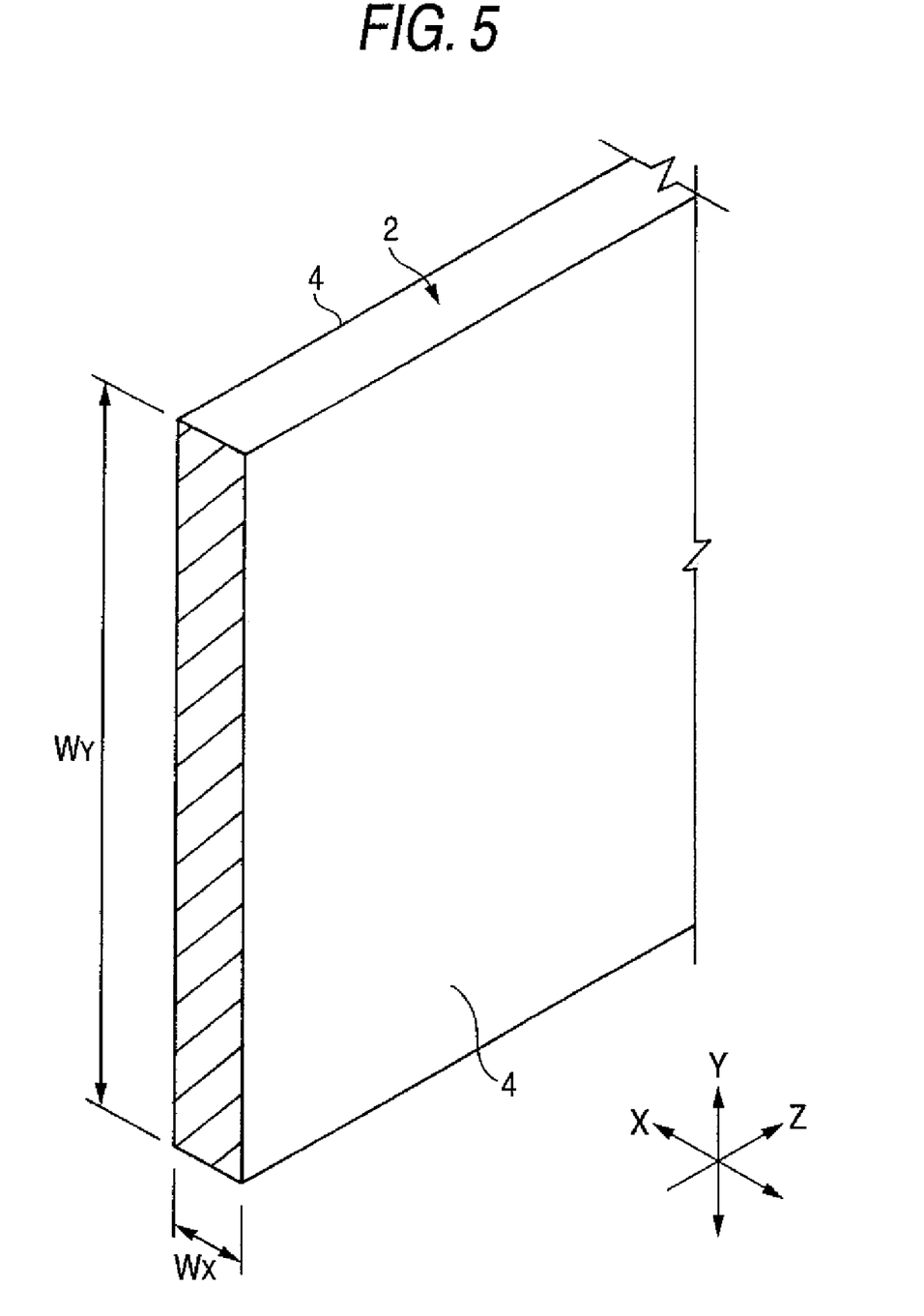
FIG. 5 is a schematic perspective view partially showing an example of a ribbon-like ion beam.

When denoting a traveling direction as Z and two directions substantially perpendicular to each other as X and Y, as shown in FIG. 5, the ion beams 2 that are incident on the electric field lens 20 have a ribbon shape in which an X-direction size $W_X$ is larger than a Y-direction size $W_Y$. However, the X-direction size $W_X$ of the ribbon-like ion beams 2 is not as thin as a paper or a cloth. For example, the X-direction size $W_X$ of the ion beams 2 is in the range of about 30 mm to 80 mm, and the Y-direction size $W_Y$ thereof is in the range of about 300 mm to 500 mm, even though it depends on a size of a target. A plane in which the ion beams 2 is large, that is, a plane following an YZ-plane is a main plane 4.

The electric field lens 20 includes an entrance electrode 22, an intermediate electrode 24, and an exit electrode 26, which are arranged at a predetermined interval in a traveling direction Z of the ion beams 2. In addition, the electric field lens 20 includes a first control electrode 28 disposed between the entrance electrode 22 and the intermediate electrode 24 and a second control electrode 30 disposed between the intermediate electrode 24 and the exit electrode 26.

The respective electrodes 22, 24, 26, 28, and 30 are disposed so as to be opposed to each other in the X direction with a space through which the ion beams 2 pass interposed therebetween. A pair of electrode pieces 22a and 22b, 24a and 24b, 26a and 26b, 28a and 28b, and 30a and 30b that are substantially parallel to each other are provided on the main plane 4 of the ion beams 2. These electrode pieces 22a, 22b, 24a, 24b, 26a, 26b, 28a, 28b, 30a, and 30b are disposed in a direction substantially perpendicular to the traveling direction Z of the ion beams 2. The electrode pieces 22a, 24a, 26a, 28a, and 30a are electrically connected to the electrode pieces 22b, 24b, 26b, 28b, and 30b via conductors, respectively.

The intermediate electrode 24 is maintained in a positive potential, and the potential of the entrance electrode 22 and the exit electrode 26 are maintained lower than that of the intermediate electrode 24. The potential of the first control electrode 28 is maintained lower than that of the entrance electrode 22, and the potential of the second control electrode 30 is maintained lower than the exit electrode 26.

More specifically, in the exemplary embodiment, the entrance electrode 22 and the exit electrode 26 are electrically grounded and are maintained in a ground potential. The intermediate electrode 24 is connected to a DC power supply 32 which applies a positive DC voltage $V_2$ thereto and maintained in a positive potential. The first control electrode 28 is connected to a DC power source 34 which applies a negative DC voltage $V_3$ thereto and maintained in a negative potential. The second control electrode 30 is connected to a DC power source 36 which applies a negative DC voltage $V_4$ thereto and maintained in a negative potential.

Since the potentials of the entrance electrode 22 and the exit electrode 26 are maintained equal to each other and the potential of the intermediate electrode 24 is maintained different from that of the entrance electrode 22 and the exit electrode 26, the electric field lens 20 functions as an einzel lens. Therefore, it is possible to focus the ion beams 2 in the X direction without the variation in the energy of the ion beams 2.

As an absolute value (magnitude) of a DC voltage $V_2$ which is applied from the DC power source 32 to the intermediate electrode 24 becomes large, it is possible to strongly focus the ion beams 2. In addition, a degree of focusing the ion beams 2 varies depending on the energy of the ion beams 2 when the ion beams 2 pass through the electric field lens 20. The larger the energy of the ion beams 2 becomes, the smaller a deflection operation of the DC voltage $V_2$ affecting the ion beams 2 becomes. Thus, in order to strongly focus the ion beams 2, the absolute value of the DC voltage $V_2$ is allowed to be large. For example, when it is assumed that a voltage corresponding to the energy of the ion beams 2 is $V_E$, the DC voltage $V_2$ is, for example, before and after "$0.5 V_E$~$0.8 V_E$". The energy of the ion beams 2 is, for example, about 10 keV or less.

In addition, in the electric field lens 20, the potentials of the first control electrode 28 and the second control electrode 30 are maintained lower than those of the entrance electrode 22 and the exit electrode 26, specifically, are maintained in a negative potential. Thus, as shown in FIG. 1, an electric field formed by the first control electrode 28 and the second control electrode 30 pushes electrons 8, which try to enter from the drift spaces on upstream and downstream sides of the intermediate electrode 24 to the intermediate electrode 24, so that the electrons are returned. As a result, the electrons 8 can be prevented from being attracted to the intermediate electrode 24 and annihilated. Accordingly, even when the intermediate electrode 24 is maintained in a positive potential, it is possible to suppress a decrease in quantity of electrons in the drift space and further suppress divergence of the ion beams 2 due to a space-charge effect. As a result, it is possible to suppress a reduction of transporting efficiency of the ion beams 2 caused by a space-charge effect.

Moreover, since the intermediate electrode 24 is maintained in a positive potential and the potentials of the entrance electrode 22 and the exit electrode 26 are maintained lower than that of the intermediate electrode 24, it is possible to suppress occurrences of energy contamination of elements having a higher energy than the incident ion beams 2. That is, in the same manner as the case where a positive DC voltage $V_1$ is applied to the intermediate electrode 14 in FIG. 7, the ion beams 2 decelerate in a section between the entrance electrode 22 and the intermediate electrode 24 and then accelerate in a section between the intermediate electrode 24 and the exit electrode 26, thereby becoming an original energy. In this deceleration section, when the ion beams 2 collide with a residual gas and then a neutral particle is generated by a charge conversion, the neutral particle causes energy contamination. However, the energy of the neutral particle generated in the deceleration section is lower than that of the incident ion beams 2, thereby preventing occurrences of energy contamination of high-energy element.

An electron capable of contributing to neutralizing the space charge of the ion beams 2 is mainly a low-energy electron of about 10 eV or less. Thus, the magnitude $|V_3|$ and $|V_4|$ of the negative DC voltages $V_3$ and $V_4$ that are capable of applying a voltage in the range of about −10 to −20 V to the vicinity of the center axis in a traveling path of the ion beams 2 is preferable since the electrons can be pushed and returned. That is, the magnitude of the negative DC voltages $V_3$ and $V_4$ may be sufficiently lower than the voltage $V_E$ corresponding to the energy of the ion beams 2. For example, when the energy of the ion beams 2 is 10 keV, the magnitude of the DC voltages $V_3$ and $V_4$ may be in the range of about 500 V to 1 kV.

Accordingly, there are provided control electrodes 28 and 30 to which such negative DC voltages $V_3$ and $V_4$ are applied. Thanks to an influence of the control electrodes 28 and 30, a neutral particle having a higher energy than the incident ion beams 2 is hardly generated, that is, energy contamination of high-energy element hardly occurs. Further, it hardly affects its original lens function (beam focusing effect) of the entrance electrode 22, the intermediate electrode 24, and the exit electrode 26.

In addition, the magnitude may be any one of $|V_3|=|V_4|$ and $|V_3|\neq|V_4|$. The same applies to an exemplary embodiment described below.

Moreover, positive DC voltages of different values may be applied to the pair of electrode pieces 24a and 24b constituting the intermediate electrode 24 by providing two DC power sources. With such an operation, it is possible to adjust the direction of the ion beams 2 emitted from the electric field lens 20. The same applies to the exemplary embodiment described below.

Figure 3:
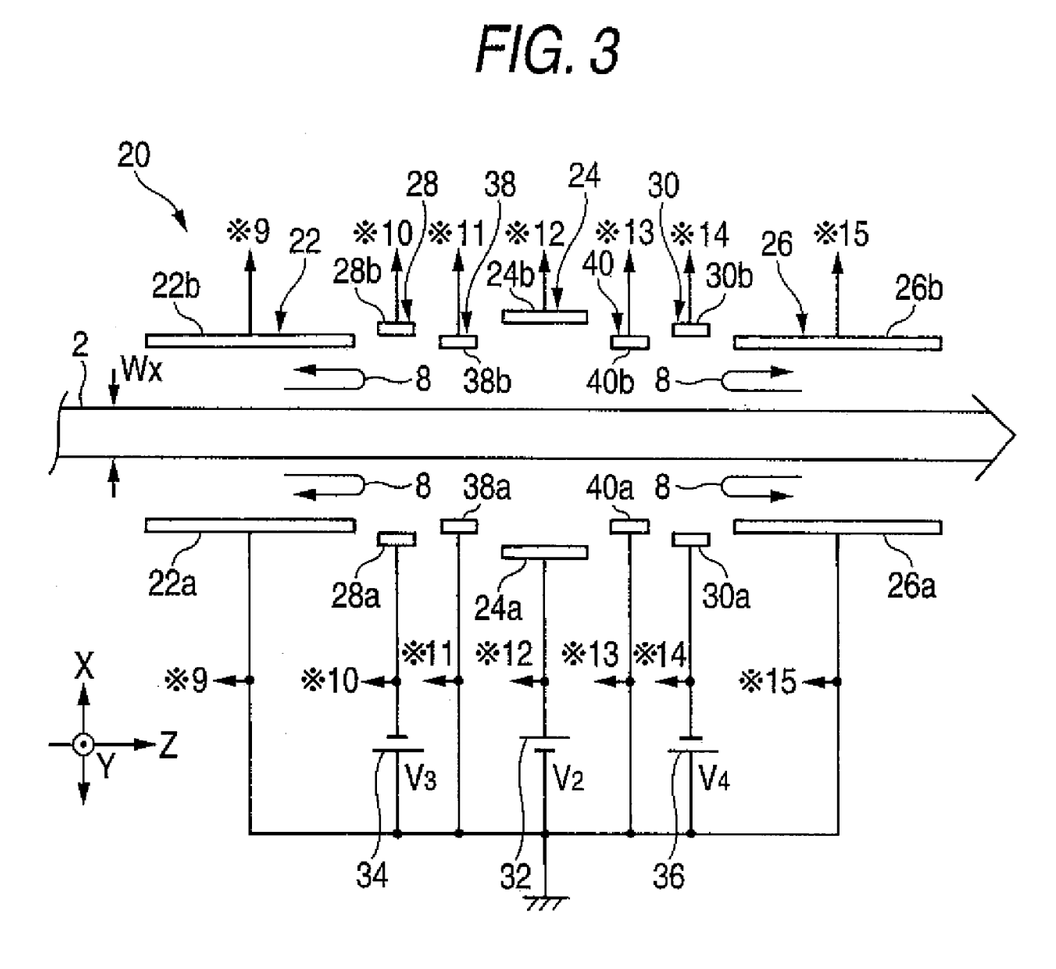
FIG. 3 is a top plan view showing an electric field lens along with a power source according to another exemplary embodiment of the present invention.
Figure 4:
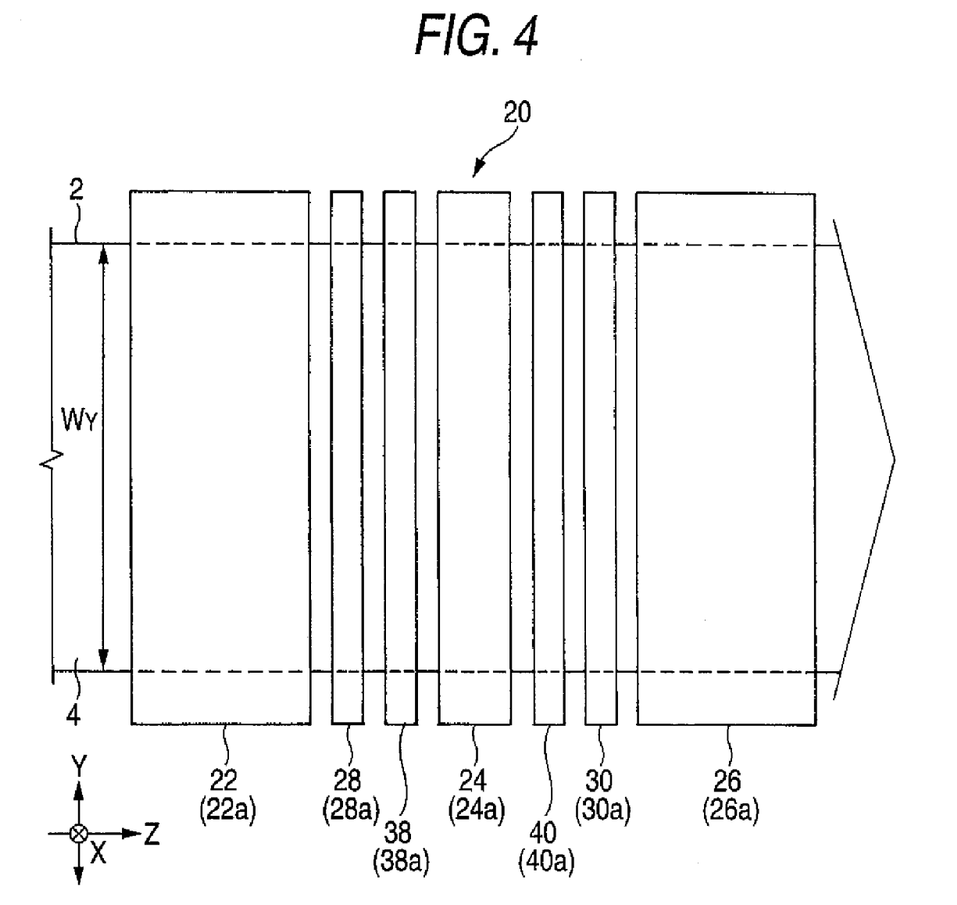
FIG. 4 is a front view showing the electric field lens in FIG. 3.

FIG. 3 is a top plan view showing an electric field lens along with a power source according to another exemplary embodiment of the present invention. FIG. 4 is a front view showing the electric field lens shown in FIG. 3. The same reference numerals are given to the same or corresponding constituents of the exemplary embodiment shown in FIGS. 1 and 2. Hereinafter, differences between the foregoing exemplary embodiment and the following exemplary embodiment will be mainly described.

Further, the electric field lens 20 includes a first ground electrode 38 disposed between the intermediate electrode 24 and the first control electrode 28 and a second ground electrode 40 disposed between the intermediate electrode 24 and the second control electrode 30. Both of the ground electrodes 38 and 40 are electrically grounded and are maintained in a ground potential.

Each of the ground potentials 38 and 40 is disposed so as to be opposed to each other in the X direction with a space through which the ion beams 2 pass interposed therebetween, and includes a pair of electrode pieces 38a and 38b and a pair of electrode pieces 40a and 40b that are substantially parallel to the main plane 4 of the ion beams 2. These electrode pieces 38a, 38b, 40a, and 40b are disposed in a direction substantially perpendicular to the traveling direction Z of the ion beams 2. The electrode pieces 38a and 40a and the electrode pieces 38b and 40b are electrically connected to each other via a conductor, respectively.

In the electric field lens 20, by a ground potential formed by the first ground electrode 38 and the second ground electrode 40 and a space distance due to existence of the electrodes 38 and 40, it is possible to suppress that a positive electric field formed by the intermediate electrode 24 protrudes toward the first control electrode 28 and the second control electrode 30. Therefore, since the first control electrode 28 and the second control electrode 30 easily form an electric field for pushing and returning the electrons 8 in the drift space, the magnitude of the negative DC voltages $V_3$ and $V_4$ that are applied to the first control electrode 28 and the second control electrode 30 becomes smaller than that of the above-described exemplary embodiment. Accordingly, it is possible to further reduce a possibility of occurrences of energy contamination of the high-energy element and influences on the original lens function comparing with the above-described exemplary embodiment to which the control electrodes 28 and 30 are provided.

In addition, the electric field lens 20 is described by exemplifying the einzel lens, but not limited to the example. For example, the potentials of the entrance electrode 22 and the exit electrode 26 may be a ground potential. The potential of the entrance electrode 22 and the exit electrode 26 may be different from each other. Furthermore, the ion beams 2 may have a shape other than a ribbon.

Figure 6:
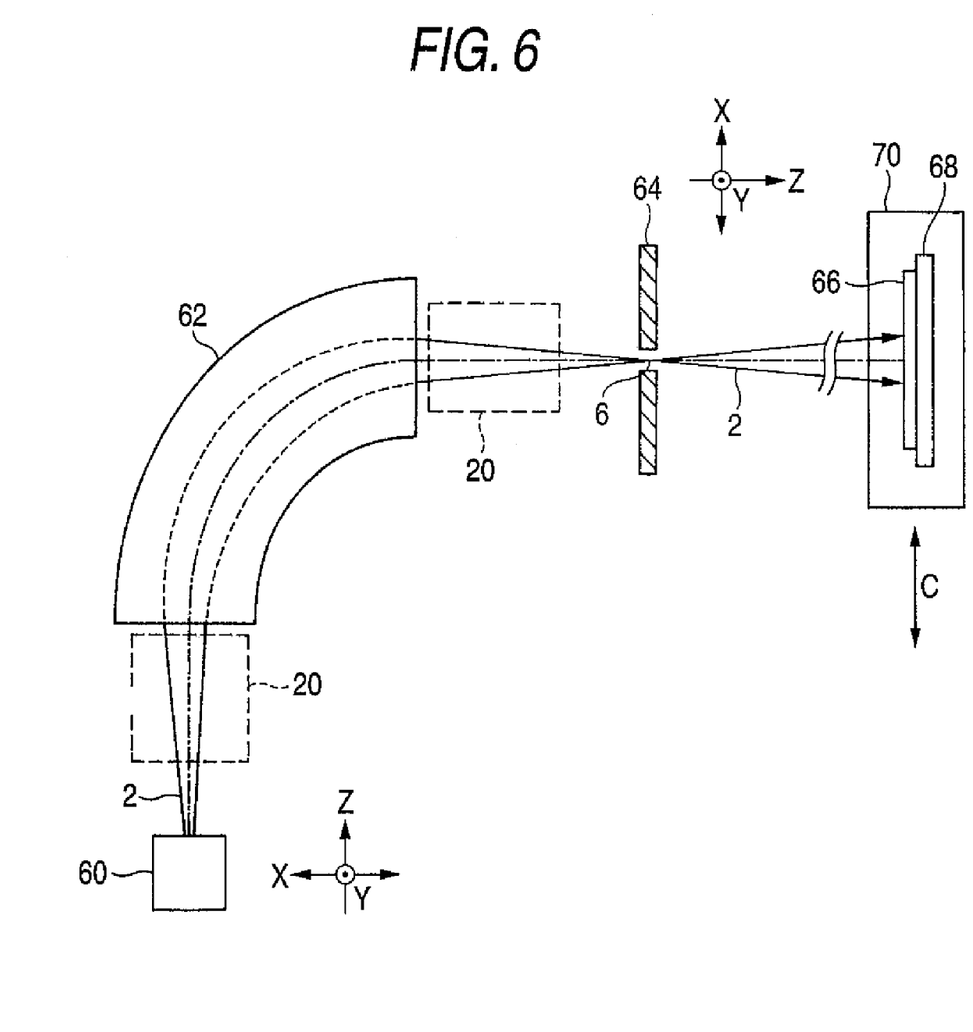
FIG. 6 is a schematic top plan view showing an example of an ion implanter provided with the electric field lens.

An ion implanter that has the electric field lens 20 and allows the ion beams 2 passing through the electric field lens 20 to be incident on a target may be configured. In such an ion implanter, the same effects as that of the above-mentioned electric field lens 20 can be acquired since the electric field lens 20 is provided. An example of such an ion implanter is shown in FIG. 6.

The ion implanter is an example in which the ribbon-like ion beams 2 are incident on a target 66 so as to implant the ion therein. The ion implanter includes a ion source 60 for generating a ribbon-like ion beams 2, an analyzing magnet 62 that analyzes a momentum (which, for example, is a mass analysis and the following description is the same) of the ion beams 2 by deflecting the ion beams 2 generated from the ion source 60 and forms a focus 6 of the ion beams 2 having a desired momentum on the downstream side, and a resolving slit 64 that is provided in the proximity of the focus 6 of the ion beams 2 from the analyzing magnet 62 and analyzes a momentum of the ion beams 2 along with the analyzing magnet 62. In the exemplary embodiment, the analyzing magnet 62 deflects the ribbon-like ion beams 2 toward a direction (that is, the X direction) substantially perpendicular to the main plane 4 (see FIG. 5 and so forth), and focuses the ion beams 2 in the X direction, thereby forming the focus 6.

In addition, the ion implanter includes a target driving device for linearly reciprocating the target 66 held in a holder 68 in a direction perpendicular to the main plane 4 of the ion beams 2 (see arrow C), in an implanting position in which the ion beams 2 after passing through the resolving slit 64 is allowed to be incident on the target 66. That is, the target driving device mechanically implants the ion beams 2. The traveling path of the ion beams 2 from the ion source 60 to the target 66 is maintained in a vacuum state.

The size $W_Y$ in the Y direction of the ion beams 2 that is generated from the ion source 60 and transported to the target 66 is larger than that in the Y direction of the target 66. Further, the ion beams 2 can be incident on an entire surface of the target 66 for an ion implanting by reciprocating the target 66 in the same manner as the above description. The target 66 is, for example, a semiconductor substrate, a glass substrate, and other substrate. The plane shape may be any one of a circular shape and a rectangular shape.

The above-described electric field lens 20 is provided in any one or both of an area between the ion source 60 and the analyzing magnet 62 and an area between the analyzing magnet 62 and the resolving slit 64. The ion beams 2 during a period of transporting is inclined to get broader in the X direction due to an influence of the space charge and a focus 6 thereby deviates from the resolving slit 64 to the downstream side.

However, it is possible to conduct a correction operation that the position of the focus 6 is allowed to return to the upstream side and then positioned at the resolving slit 64 by focusing the ion beams 2 in the X direction by means of the electric field lens 20. As a result, it is possible to improve both transporting efficiency and resolution of the ion beams 2 by compensating the space-charge influence.

While the invention has been described with respect to a limited number of exemplary embodiments, those skilled in the art, having benefit of this disclosure, will appreciate that other exemplary embodiments can be devised which do not depart from the scope of the invention as disclosed herein. Accordingly, the scope of the invention should be limited only by the attached claims.

What is claimed is:

1. An electric field lens comprising:
   an entrance electrode, an intermediate electrode, and an exit electrode, which are mutually spaced in a traveling direction of an ion beam, in which the intermediate electrode is maintained in a positive potential and the entrance electrode and the exit electrode are maintained in a potential lower than the intermediate electrode so as to focus the ion beam;
   a first control electrode that is disposed between the intermediate electrode and the entrance electrode and that is maintained in a potential lower than the entrance electrode; and
   a second control electrode that is disposed between the intermediate electrode and the exit electrode and that is maintained in a potential lower than the exit electrode.

2. The electric field lens according to claim 1, further comprising:
   a first ground electrode that is disposed between the intermediate electrode and the first control electrode and that is maintained in a ground potential; and
   a second ground electrode that is disposed between the intermediate electrode and the second control electrode and that is maintained in a ground potential.

3. The electric field lens according to claim 1,
   wherein the entrance electrode and the exit electrode are maintained in a ground potential, and
   wherein the first control electrode and the second control electrode are maintained in a negative potential.

4. The electric field lens according to claim 1,
   wherein when two directions perpendicular to each other in a plane perpendicular to the traveling direction of the ion beam are denoted by an X direction and a Y direction, the ion beam has a ribbon shape in which an Y-direction size is larger than a X-direction size, and wherein the respective electrodes are disposed oppositely each other in the X direction with an ion beam-transmitting space interposed therebetween and include a pair of electrode pieces substantially parallel to a main plane of the ion beam, so as to focus the ion beam in the X direction.

5. An ion implanter comprising:

the electric field lens according to claim 1, wherein the ion beam having passed through the electric field lens is allowed to be incident on a target.

6. The ion implanter according to claim 5, further comprising:

a ion source that generates the ion beam;

an analyzing magnet that analyzes a momentum of the ion beam by deflecting the ion beam generated from the ion source and forms a focus of the ion beam having a desired momentum on the downstream side; and a resolving slit that is provided in the proximity of the focus of the ion beam from the analyzing magnet and analyzes the momentum of the ion beam along with the analyzing magnet, wherein the electric field lens is disposed between the ion source and the analyzing magnet or between the analyzing magnet and the resolving slit.

7. The ion implanter according to claim 6, wherein said ion implanter comprises two electric field lenses, which are disposed between the ion source and the analyzing magnet and between the analyzing magnet and the resolving slit, respectively.

* * * * *